(12) United States Patent
Elmhurst

(10) Patent No.: US 6,480,417 B2
(45) Date of Patent: Nov. 12, 2002

(54) GLOBAL/LOCAL MEMORY DECODE WITH INDEPENDENT PROGRAM AND READ PATHS AND SHARED LOCAL DECODE

(75) Inventor: Daniel R. Elmhurst, Cameron Park, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/809,416

(22) Filed: Mar. 15, 2001

(65) Prior Publication Data

US 2002/0131301 A1 Sep. 19, 2002

(51) Int. Cl.$^7$ .............................. G11C 16/04
(52) U.S. Cl. .............. 365/185.11; 365/185.13; 365/185.18; 365/185.28
(58) Field of Search .............. 365/185.11, 185.17, 365/185.28, 185.13, 185.01

(56) References Cited

U.S. PATENT DOCUMENTS

| | | | |
|---|---|---|---|
| 5,847,994 A | * 12/1998 | Motoshima et al. | 365/185.11 |
| 5,894,437 A | * 4/1999 | Pellegrini | 365/185.06 |
| 5,978,264 A | * 11/1999 | Onakado et al. | 365/185.11 |
| 6,016,270 A | * 1/2000 | Thummalapally et al. | 365/185.11 |

* cited by examiner

Primary Examiner—Hoai Ho
(74) Attorney, Agent, or Firm—Blakley, Sokoloff, Taylor & Zafman LLP

(57) ABSTRACT

A memory cell selection scheme that permits simultaneous reading and writing of cells in different memory blocks by using separate routing for bias voltages to the cells. A read path and a program path are used to separately route the read and program voltages to a memory block. Separate read and program transistors are used to selectively route one of those two voltages to a regional voltage line, where individual local voltage transistors can selectively route voltage from the regional voltage line to local voltage lines. By placing a separate set of read and program transistors in each block, each block can be configured to conduct either read or program operations without regard to which of those functions is being performed in other blocks.

15 Claims, 6 Drawing Sheets

GLOBAL/LOCAL MEMORY DECODE WITH INDEPENDENT PROGRAM AND READ PATHS AND SHARED LOCAL DECODE

BACKGROUND OF THE INVENTION

1. Field of the Invention

The invention pertains generally to computers. In particular, it pertains to computer memory circuitry.

2. Description of the Related Art

Flash memory is a type of rewritable memory that stores data in each cell by charging up a floating transistor gate to a predetermined charge level, which the transistor can then retain for an extended period of time. Each cell, which can be represented by a single transistor, can be 1) programmed (written) by charging up the floating gate of the transistor to a predetermined level, 2) read by sensing the amount of stored charge in the floating gate, and 3) erased by draining the stored charge from the transistor. Each of these functions requires a different set of bias voltage on the transistor. As an example, one type of flash memory requires voltages on the gate/source/drain, respectively, of approximately 10/0/5 for programming, −9/0/0 for erasing, and 5/0/1 for reading.

To save valuable space on the die, large numbers of these cells have common connections so that a single voltage line may connect multiple gates, another single voltage line may connect multiple drains, and another single voltage line may connect multiple sources. Each of these groups of connections can then be serviced by a single, switchable voltage supply, so that all common connections in a group can have the same bias voltage and the entire group of cells can be biased for the same function of program, read, or erase. By connecting these common voltage lines in a column/row matrix, individual cells can be addressed, while still minimizing the amount of die space devoted to these interconnections. FIG. 1 shows an example of six memory cells 2–7, which can be a small subset of a much larger block of thousands of cells. The sources of all six are connected together by a common source line 14, which can supply a common source voltage to all six cells. The gates of cells 2–4 are connected to one common gate line 11, while the gates of cells 5–7 are connected to another common gate line 12, so that either cells 2–4 or cells 5–7 can be selected by placing the proper voltage on one of these common gate lines. The drains of cells 2, 5 are likewise connected to one common drain line 15, cells 3, 6 to a second common drain line 16, and cells 4, 7 to a third common drain line 17. To select a single cell, the source, gate, and drain lines to that particular cell are activated. For example, by placing proper read voltages on source line 14, gate line 11, and drain line 16, only cell 3 would have all the proper bias voltage for reading, and any value detected during the read operation would be attributed to cell 3.

Due to the preferred method of organizing cells, the common gate lines are typically referred to as wordlines, and the common drain lines are typically referred to as bitlines. A typical memory may have many cells grouped together in a block in the manner described. For example, in a flash memory, each wordline may be connected to 512 cells, and each bitline may be connected to 1024 cells, for a total of over 0.5 million cells per block, with eight blocks in a plane. Multiple planes can be combined into a memory array. The array, plane, block, word, and bit numbers can be decoded from a memory address to select the particular cell that is being addressed.

Global voltage lines are typically switched on or off separately to each array, so that cells in each array can be programmed, read, or erased independently of the other arrays. However, within each array, all planes may be required to perform the same function if the cells in those arrays are addressed at the same time, due to their common global voltage line. FIG. 2 shows a conventional bitline selection circuit for an array 20, in which a switch or multiplexer 21 can switch the drain voltage for either a read operation (read voltage VR), or a program operation (program voltage VP) to array 20. Within the array, transistor switch 22 can connect that voltage to global bitline GBL, or disconnect it if that voltage is not needed in the array at that time. Since the same global bitline goes to multiple planes and to all blocks 0, 1, 2, etc., within those planes, these planes and blocks are all simultaneously biased for only one of the functions of program, read, and erase. Within Block 0, transistors 26-0, 1, 2, 3 (through 26-n, where n is the highest-numbered bitline) can direct that voltage to any of local bitlines LBL1, 2, 3, etc., where the voltage can be provided to any of the memory cells 29-x (only one cell is shown in the drawing for clarity) that are connected to that bitline and that are selected by the appropriate wordline (not shown in FIG. 2). Bitlines 15–17 in FIG. 1 can be considered local bitlines. At the same time, each of Blocks 1, 2, etc. will have their own equivalent of transistors 26-0, 1, 2, etc., so that each block can simultaneously select a different local bitline, and therefore a different memory cell.

This conventional addressing scheme prevents memory cells in the same array from performing different operations at the same time, since the global bitline provides the same bitline bias voltage to the blocks and planes within an array. Thus a read-while-write function (read one cell while programming another) cannot be performed unless the read and write operations take place in different arrays, with each array typically representing 10's of megabits of addressable memory.

DETAILED DESCRIPTION OF THE INVENTION

Various embodiments of the invention can permit different blocks within a single memory plane to perform different operations at the same time by allowing each block to be individually selected for different operations. For example, one block within the memory plane can perform a read operation while another block within the same memory plane can perform a program operation at the same time.

Figure 3:
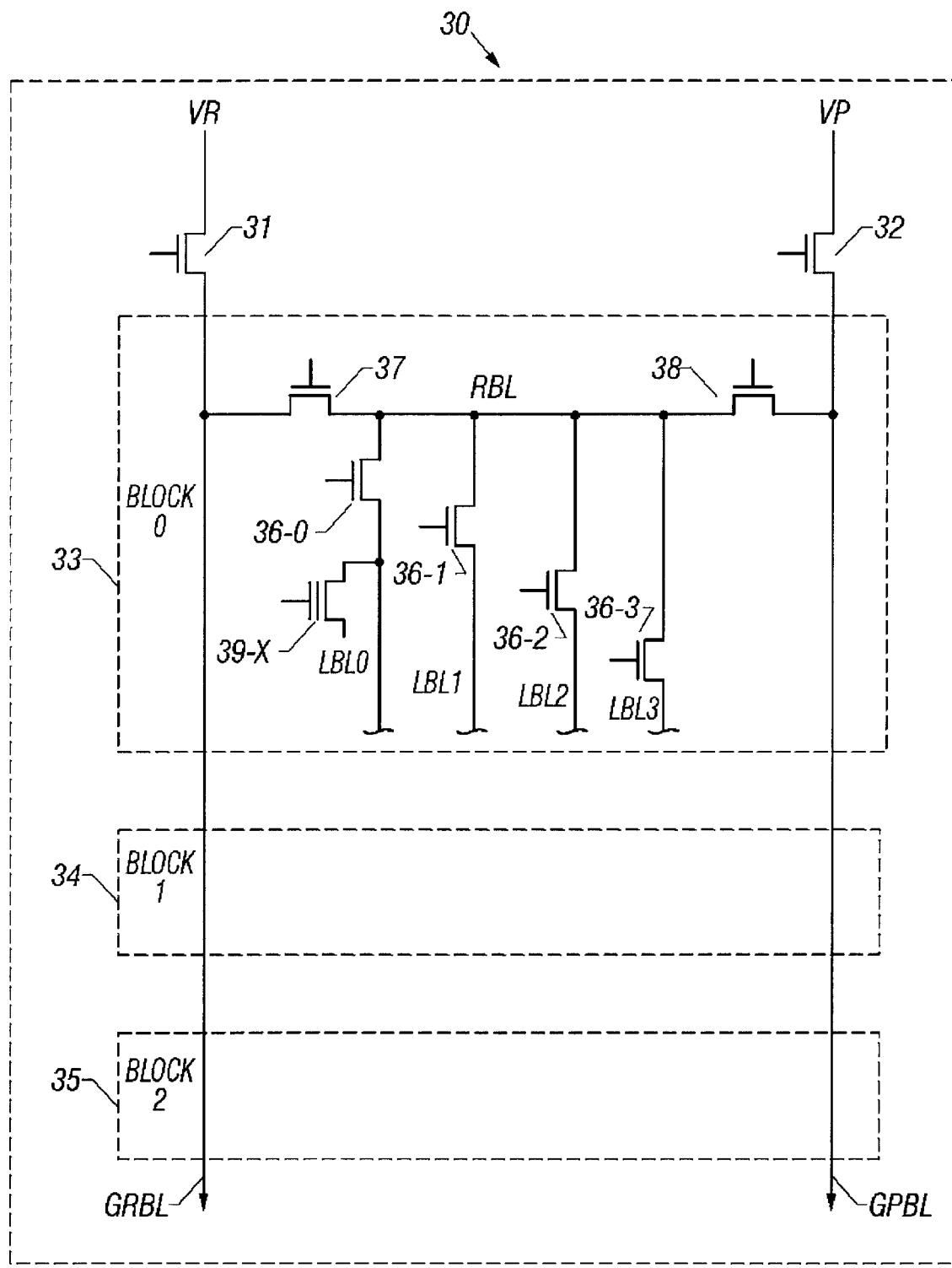
FIG. 3 shows a selection scheme of one embodiment.

FIG. 3 shows an embodiment of a memory array 30, in which a bitline path to one or more memory cells is selected to provide a bias voltage to the cell(s). Although the description is written in terms of bitline paths, the description can also apply to other paths, such as wordline paths. The various lines and transistors can be generically referred to as selection lines and selection transistors to encompass embodiments that use bitlines, wordlines, or other applicable memory selection lines.

A read voltage VR from a voltage source can be provided to the circuit by using transistor 31 to switch the read voltage onto global read bitline GRBL. This read voltage can be the voltage level that is appropriate for the bitline of a memory cell when a read operation is being performed on that memory cell. A program voltage VP from another voltage source can be provided to the circuit by using transistor 32 to switch the program voltage onto global program bitline GPBL. This program voltage can be the voltage level that is appropriate for the bitline of a memory cell when a program (i.e., write) operation is being performed on that memory cell. The global lines GRBL and GPBL can extend to multiple blocks in a memory chip. In one embodiment, GRBL and GPBL extend to all the blocks in a plane, with multiple planes on the memory chip, each plane having its own equivalent of GRBL and GPBL. The number of planes per memory array, blocks per plane, and memory cells per block may vary, depending of the organizational structure designed into the memory. These terms are used in the art to define a hierarchy of elements in the structure, but the exact number of each type of element may vary, and is not critical to the practice of the invention, as will be understood by those of skill in the art. One embodiment has eight blocks per plane, with each block containing approximately half a million memory cells.

FIG. 3 shows three memory blocks 33–35, labeled Block 0, Block 1, and Block 2, with the arrows at the bottom of the figure implying that GRBL and GPBL can extend to more blocks that have been excluded from the figure to avoid making the drawing overly complex. In one embodiment, all of these blocks are in a single plane. If none of the blocks in the plane are undergoing an operation, transistors 31, 32 can both be turned off to reduce power consumption. If any block in the plane is undergoing a read operation, transistor 31 can be turned on to supply the read voltage to GRBL. If any block in the plane is undergoing a program operation, transistor 32 can be turned on to supply the program voltage to GPBL.

Additional internal circuitry is shown for Block 0, which may be typical of the remaining blocks. A read selection transistor 37 can be used to selectively switch the read voltage on GRBL onto a regional bitline (RBL). Alternatively, a program selection transistor 38 can be used to selectively switch the program voltage onto the regional bitline RBL. If no operation is being performed on any cell in the block, transistors 37, 38 can both be turned off. However, transistors 37, 38 should not be turned on at the same time, as this could short the read voltage to the program voltage and potentially cause damage to the circuit.

Figure 1:
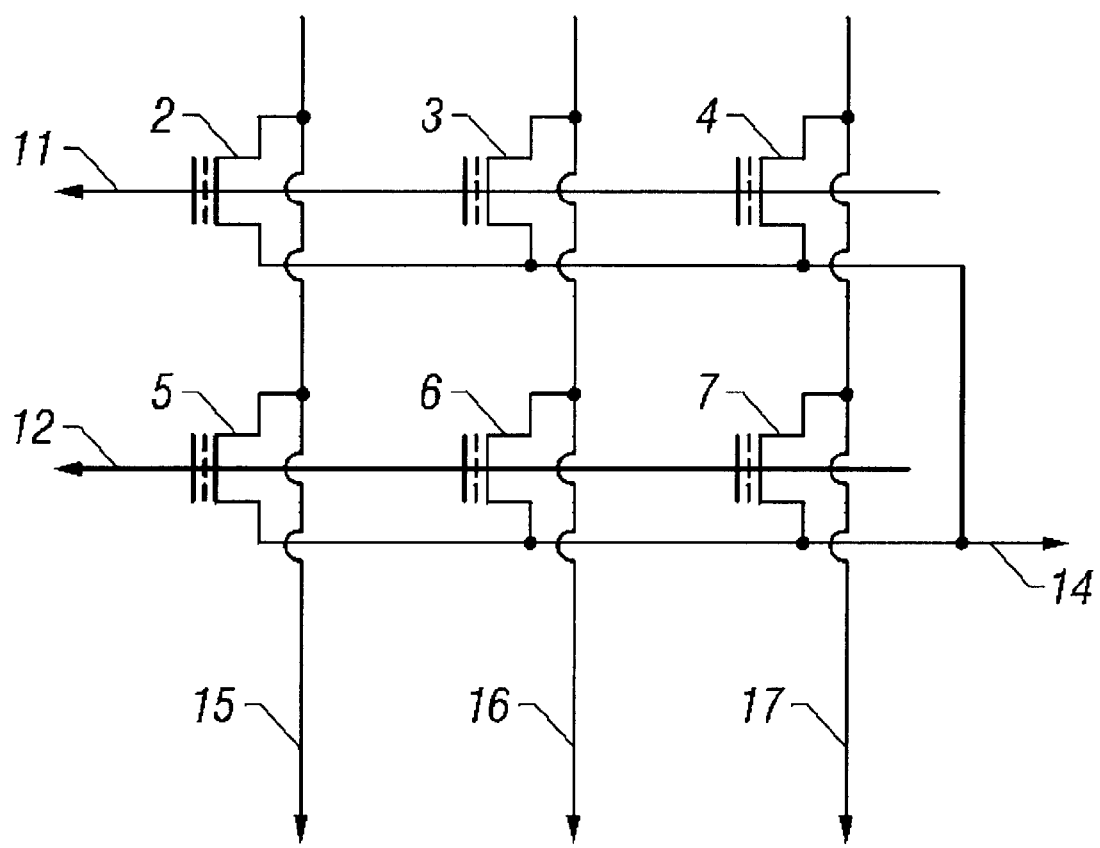
FIG. 1 shows a matrix selection scheme of the prior art.
Figure 2:
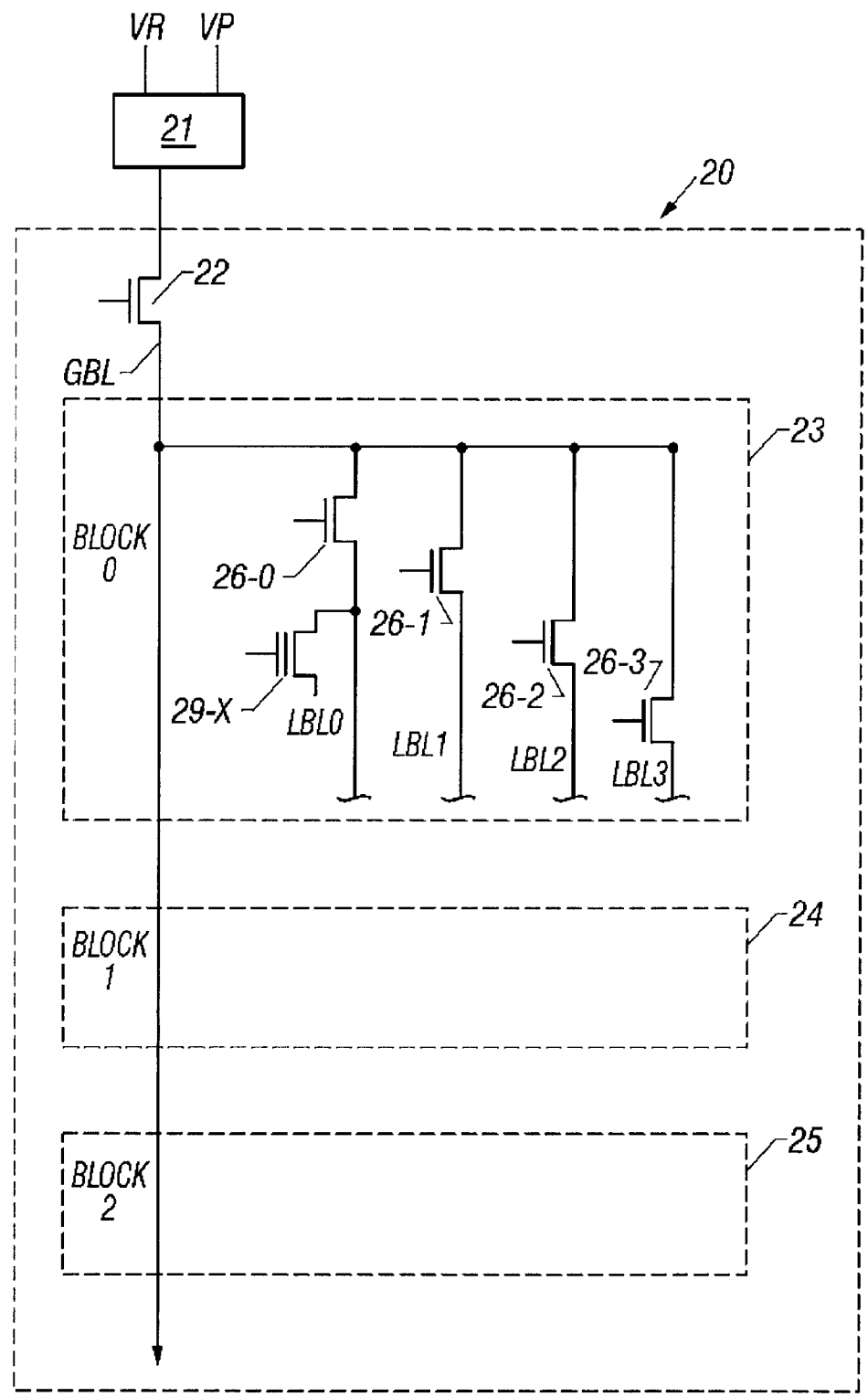
FIG. 2 shows a bitline selection scheme of the prior art.

Local selection transistor 36-0 can be used to connect the voltage on RBL to local bitline 0 (LBL0). If transistor 37 is on and transistor 38 is off, a read voltage will be on RBL and therefore connected to LBL0. If transistor 38 is on and transistor 37 is off, a program voltage will be on RBL and therefore connected to LBL0. A group of multiple memory cells 39-$x$ can be connected to LBL0. For clarity, only one such cell is shown in the drawing, but in one embodiment, there are 512 memory cells connected to LBL0. Wordline connections can be used to select only one of these 512 cells for a particular operation, as is known to those of skill in the art. Local selection transistor 36-1 can be used to connect the voltage on RBL to local bitline 1 (LBL1), in a manner analogous to LBL0. LBL1 can also have a group of multiple memory cells (not shown) connected to it. Local selection transistors 36-2 and 36-3 can perform similar functions for local bitlines LBL2 and LBL3, which can have similar groups of memory cells connected to them. In one embodiment, each local bitline can have its own group of 512 memory cells connected to it. With this structure, a read voltage on GRBL can be passed on to any of the groups of memory cells on any of the local bitlines in Block 0, and one or more memory cells within the selected group can be further selected for a read operation by activating the proper wordline and source connections, which can be arranged in the matrix format exemplified by FIG. 1. Alternatively, a program voltage on GPBL can be passed on to any of the groups of memory cells on the local bitlines in Block 0.

Each of the other blocks (Block 1, Block 2, and additional blocks not shown) in the plane can have their own read selection transistor, program selection transistor, regional bitline, local selection transistors, and local bitlines, in a manner analogous to Block 0. Since each block can separately and individually select either the read voltage or the program voltage for its own regional bitline, and pass that voltage on to any of its local bitlines and individual memory cells, each block may read or program independently of whether the other blocks in the plane are doing likewise. For example, Block 0 might perform a read operation while Block 2 is performing a program operation. Further, the indicated read and program operations can overlap completely in time, or can overlap only partially in time, with a portion of the read operation being performed while a portion of the program operation is being performed.

In one embodiment, the source connections of all the memory cells in a block are effectively coupled together, while the wordlines of a single row (refer to wordline 11 in FIG. 1) are coupled together but are not tied to the other wordlines in the block. Using this configuration, a single memory cell on a single local bitline in the block can be selected for reading (or programming) without selecting any of the other cells in the block, and without regard to whether a read or program operation is being performed in another block.

Figure 4:
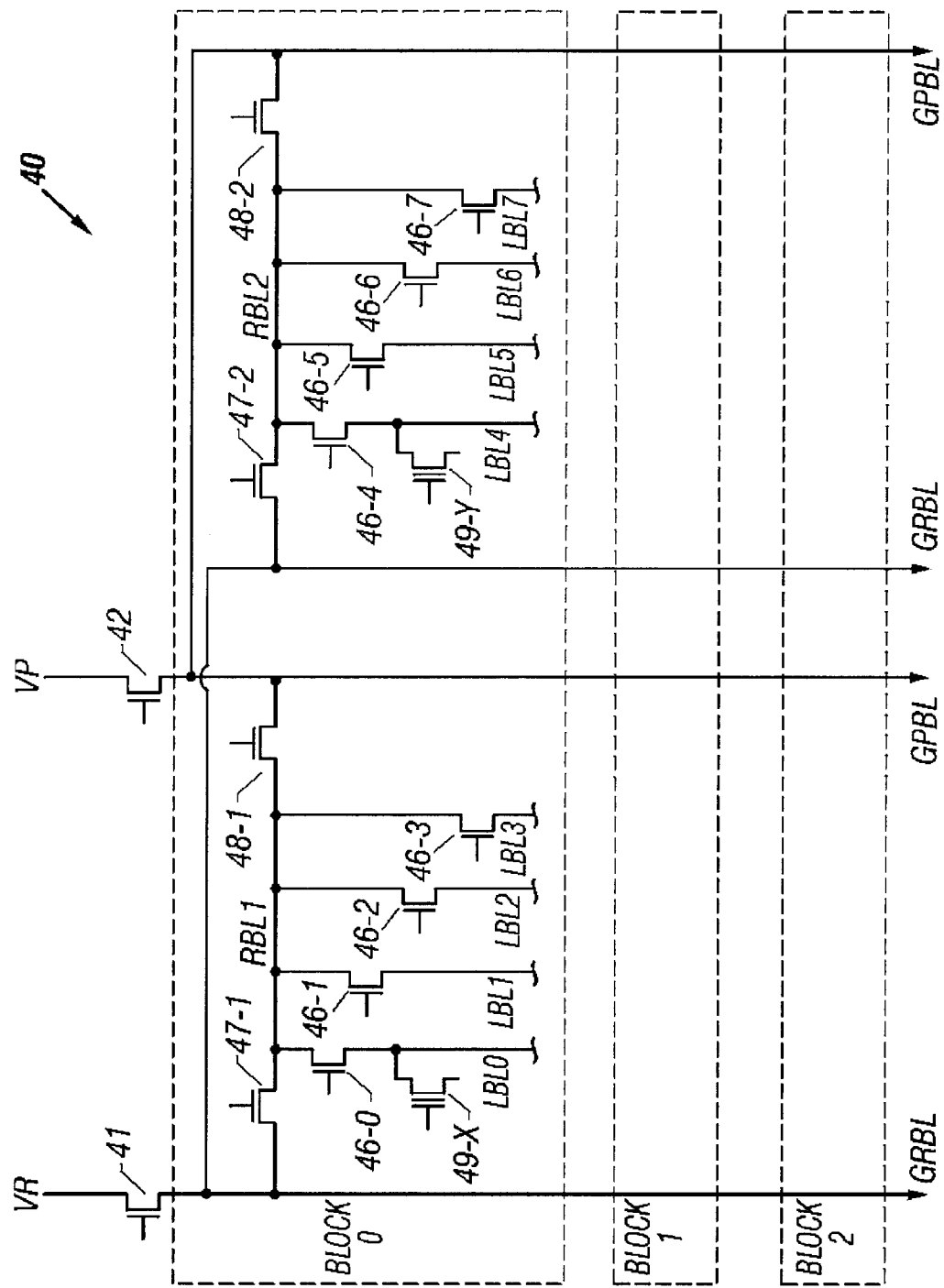
FIG. 4 shows a selection scheme of another embodiment.

FIG. 4 shows an alternate embodiment in which the ability to program and read independently is extended to the sub-block level. In a manner similar to FIG. 3, transistors 41 and 42 can be used to place the read voltage VR and program voltage VP onto GRBL and GPBL, respectively. Transistors 47-1 and 48-1 can be used to place one of those two voltages onto regional bitline PBL1, and from there the voltage can selectively be placed onto local bitlines LBL0 through LBL3 by selectively turning on transistors 46-0 through 46-3. Memory cell 49-$x$ represents one of multiple memory cells that are connected to each of the local bitlines LBL0 through LBL3, and can be individually enabled by selectively turning on the proper wordlines (not shown). Blocks 1, 2, etc., can have similar circuitry, as was previously described for FIG. 3. This portion of FIG. 4 is basically the same as FIG. 3, except that in FIG. 3, all of the local bitlines in Block 0 can be connected to RBL through their respective local selection transistors. In FIG. 4, a subset of all the local bitlines in Block 0 can be connected to RBL1, while another subset of those bitlines can be connected to a second regional bitline RBL2, which can receive a read voltage through read selection transistor 47-2 or a program voltage through program selection transistor 48-2. Local selection transistors 46-4 through 46-7 can then be used to selectively switch this voltage to local bitlines LBL4 through LBL7, each of which can have multiple memory cells 49-$y$ (only one such cell is shown for clarity). Thus Block 0 can have two regional bitlines, each of which can independently receive/distribute either the read voltage or the program voltage, without regard to which voltage the other regional bitline is receiving/distributing. The illustrated embodiment shows two regional bitlines, each with 4 local bitlines coupled to it. Other embodiments can have as many regional bitlines as is practical, each with as many local bitlines as is practical. In one embodiment, each block can have 32 regional bitlines, with each regional bitline having 32 local bitlines connected to it. Each of the remaining blocks in a plane can essentially duplicate the circuitry of Block 0. In this manner, a read-while-write operation (read one memory cell while programming another) can take place not only within the same memory plane, but also within the same memory block. Alternatively, the embodiment shown in FIG. 4 can be used to reduce the number of local selection transistors being driven by each read or program selection transistor, while maintaining a restriction of not performing a read-while-write within a single memory block.

Figure 5:
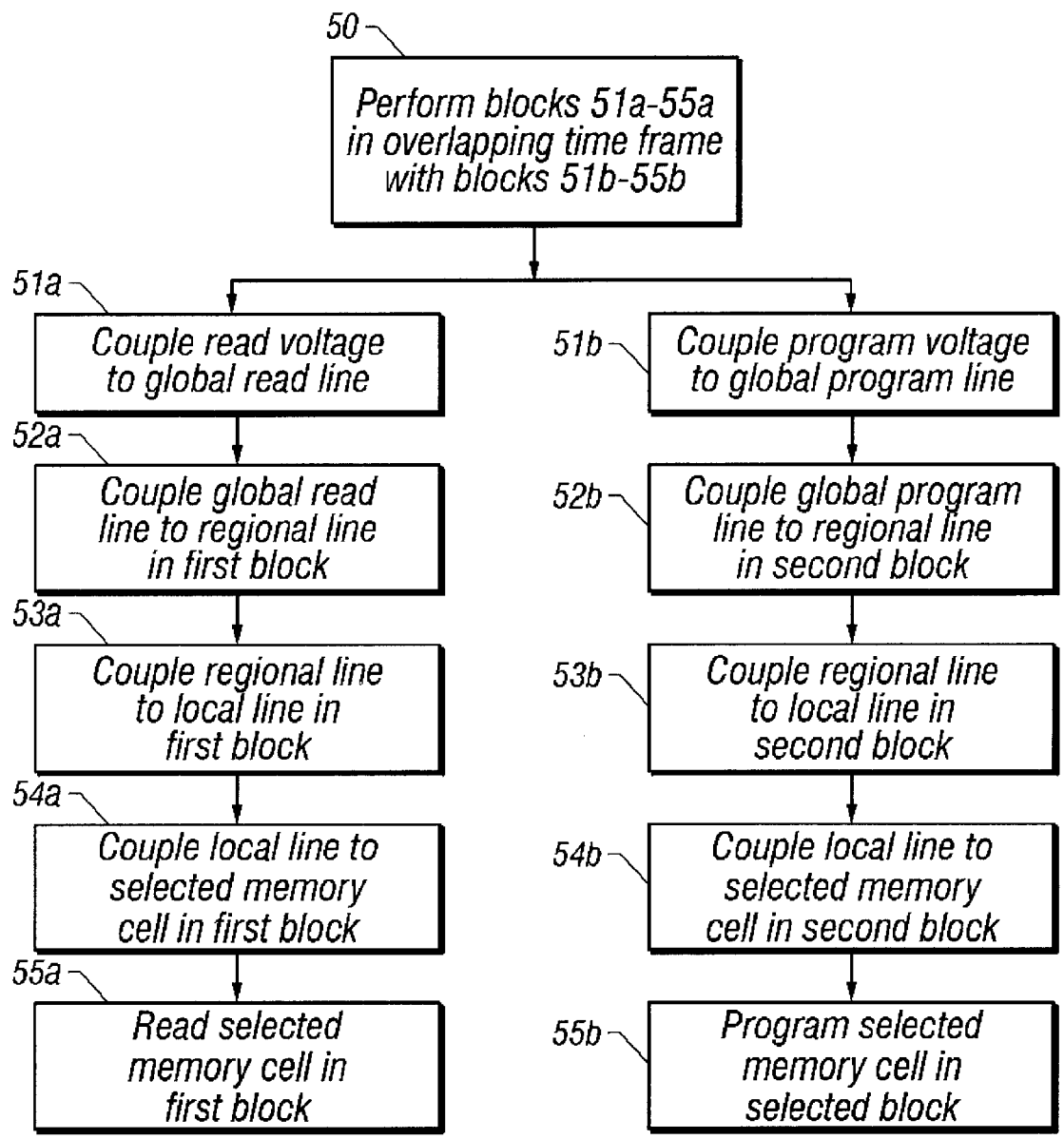
FIG. 5 shows a flow chart of a method embodiment.

FIG. 5 shows a flow chart of a method embodiment, in which a memory cell in a first block of a memory plane is selected for reading while a different memory cell in a second block of the same memory plane is selected for programming. As stated at flow chart element 50, the process described in elements 51a through 55a can be performed in a time frame that overlaps the time frame in which the process of elements 51b through 55b are performed. This condition can be satisfied if elements 51a–55a are performed simultaneously with elements 51b–55b, respectively. This condition can also be satisfied if any of elements 51a through 55a is executed after the start of element 51b and before the end of element 55b. Thus, in a read-while-write operation, the read and write (program) operations need not be synchronized to each other.

At element 51a, the read voltage can be coupled to the global read line, while at element 52a, this global read line can be coupled to a regional selection line in a first memory block. This regional selection line may be the only one in the first memory block, or one of multiple such regional selection lines in the first memory block. At element 53a, the regional selection line of element 52a can be coupled to a local selection line in the first memory block. At element 54a, the local selection line of element 53a can be coupled to a particular memory cell in the first memory block. Elements 51a through 54a, when taken in total, can couple the read voltage to a particular selected memory cell in the first memory block. Once this connection is made, the contents of that memory cell can be read at element 55a.

Elements 51b through 54b are very similar to elements 51a through 54a, except that elements 51b through 54b describe connecting a program voltage to a particular memory cell in a second memory block, using a regional selection line, local election line, and particular memory cell that are all in the second memory block. After this connection is made, the particular selected memory cell in the second memory block can be programmed at element 55b.

In the illustrated embodiments of FIGS. 3 and 4, the coupling of elements 51a–55a and 51b–55b are each performed by a single transistor switching the relevant voltage from one line to another. However, other embodiments can perform the coupling using other circuit techniques, as is known in the art.

Figure 6A:
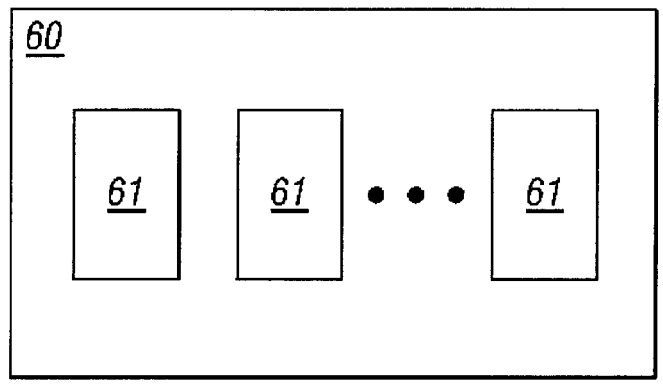
FIGS. 6a–6c show a system embodiment.
Figure 6B:
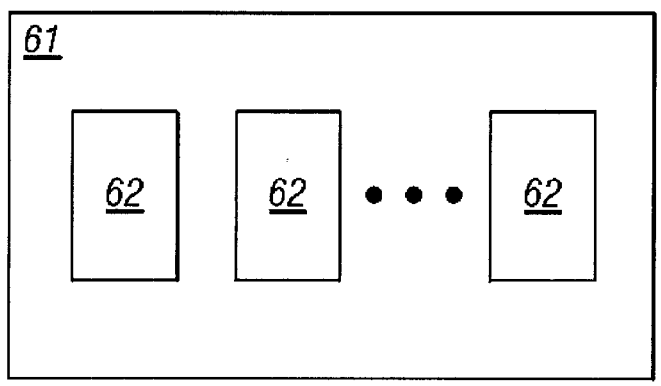
Figure 6C:
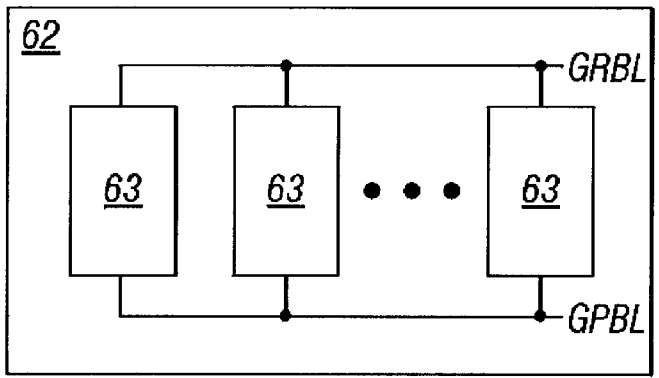

FIGS. 6a, 6b, and 6c show a system-level embodiment. Memory system 60 can include multiple memory arrays 61, as shown in FIG. 6a. In one embodiment these are flash memory integrated circuits. FIG. 6b shows an exemplary array 61, which can include multiple memory planes 62, as previously described. FIG. 6c shows an exemplary plane 62, which can include multiple memory blocks 63. Each block 63 can be one of the previously described embodiments of a memory block, and can perform according to the flow chart of FIG. 5. Each block can be coupled to the global read bitline GRBL and the global program bitline GPBL, as previously described.

The foregoing description is written in terms of a collection of selection paths for the bitline voltage in a flash memory matrix, with these bitline paths coupled to the drain connections of the memory cells. Various embodiments can also employ the same principles to wordline or other paths, and the descriptive term "selection line" can be used to encompass bitlines, wordlines, and other applicable lines. Various embodiments can also employ the same principles to provide voltage to the source connections and/or to the gate connections of the memory cells. Various embodiments can employ the same principles to memory types other than flash memory.

The foregoing description is intended to be illustrative and not limiting. Variations will occur to those of skill in the art. Those variations are intended to be included in the invention, which is limited only by the spirit and scope of the appended claims.

I claim:

1. An apparatus, comprising:
a memory circuit including a global read selection line to provide a read voltage, a global program selection line to provide a program voltage, and a plurality of memory blocks, each block being coupled to the global read selection line and to the global program selection line, each block including
a regional selection line and a plurality of local selection lines;
a read transistor coupling the global read selection line to the regional selection line to switchably apply the read voltage to the regional selection line;
a program transistor coupling the global program selection line to the regional selection line to switchably apply the program voltage to the regional selection line; and
a plurality of local selection transistors, each coupling the regional selection line to one of the local selection lines.

2. The apparatus of claim 1, further comprising:
a plurality of groups of memory cells, the memory cells of each group coupled to one of the local selection lines.

3. The apparatus of claim 2, wherein the read transistor is to couple a read voltage from the global read selection line to the regional selection line to perform a read operation on at least one of the memory cells in the plurality of groups of memory cells.

4. The apparatus of claim 2, wherein the program transistor is to couple a program voltage from the global program selection line to the regional selection line to perform a program operation on at least one of the memory cells in the plurality of groups of memory cells.

5. The apparatus of claim 1, wherein the local selection lines are local bitlines, the regional selection line is a regional bitline, the global read selection line is a global read bitline, and the global program selection line is a global program bitline.

6. The apparatus of claim 1, wherein the memory circuit is a flash memory circuit.

7. A system, comprising:
a memory system including a plurality of memory arrays, each memory array including a plurality of planes, each plane including
a global read selection line to provide a read voltage, a global program selection line to provide a program voltage, and a plurality of memory blocks, each block being coupled to the global read selection line and to the global program selection line, each block including a regional selection line and a plurality of local selection lines;

a read transistor coupling the global read selection line to the regional selection line to switchably couple the read voltage to the regional selection line;

a program transistor coupling the global program selection line to the regional selection line to switchably couple the program voltage to the regional selection line; and a plurality of local selection transistors, each coupling the regional selection line to one of the local selection lines.

8. The system of claim 1, further comprising:

a plurality of groups of memory cells, the memory cells of each group coupled to one of the local selection lines.

9. The system of claim 8, wherein the read transistor is to couple a read voltage from the global read selection line to the regional selection line to perform a read operation on at least one of the memory cells in the plurality of groups of memory cells.

10. The system of claim 8, wherein the program transistor is to couple a program voltage from the global program selection line to the regional selection line to perform a program operation on at least one of the memory cells in the plurality of groups of memory cells.

11. The system of claim 7, wherein the local selection lines are local bitlines, the regional selection line is a regional bitline, the global read selection line is a global read bitline, and the global program selection line is a global program bitline.

12. The system of claim 7, wherein the memory arrays are flash memory arrays.

13. A method, comprising:

performing a memory read operation in a first memory block by coupling a read voltage to a global read selection line extending to the first memory block and to a second memory block;

switchably coupling the read voltage from the global read selection line to a first regional selection line in the first memory block;

coupling the read voltage from the first regional selection line to a first local selection line in the first memory block;

coupling the read voltage to a first selected memory cell connected to the first local selection line in the first memory block; and performing a memory program operation in the second memory block by coupling a program voltage to a global program selection line extending the first and second memory blocks;

switchably coupling the program voltage from tie global program selection line to a second regional selection line in the second memory block;

coupling the program voltage from the second regional selection line to a second local selection line in the second memory block; and coupling the program voltage to a second selected memory cell connected to the second local selection line in the second memory block.

14. The method of claim 13, wherein at least a portion of said performing the memory read operation occurs at a same time as at least a portion of said performing the memory program operation.

15. The method of claim 13, wherein said performing the memory read operation and said performing the memory program operation occur in a same memory plane.

* * * * *

UNITED STATES PATENT AND TRADEMARK OFFICE
CERTIFICATE OF CORRECTION

PATENT NO. : 6,480,417 B2 Page 1 of 1
DATED : November 12, 2002
INVENTOR(S) : Elmhurst It is certified that error appears in the above-identified patent and that said Letters Patent is hereby corrected as shown below:

Column 4,
Line 40, delete "PBL1" and insert -- RBL1 --.

Column 8,
Line 20, delete "tie" and insert -- the --.

Signed and Sealed this

Eighteenth Day of March, 2003

JAMES E. ROGAN
*Director of the United States Patent and Trademark Office*